Sept. 9, 1969 J. E. CLARK ET AL 3,465,943

APPARATUS FOR MAKING ENCAPSULATIONS

Original Filed March 16, 1965 2 Sheets-Sheet 1

INVENTORS J. E. CLARK
I. M. ROSS
BY
Roderick B. Anderson
ATTORNEY

APPARATUS FOR MAKING ENCAPSULATIONS

Original Filed March 16, 1965 2 Sheets-Sheet 2

United States Patent Office 3,465,943
Patented Sept. 9, 1969

3,465,943

APPARATUS FOR MAKING ENCAPSULATIONS

James E. Clark, Coopersburg, Pa., and Ian M. Ross, Bethesda, Md., assignors to Bell Telephone Laboratories, Incorporated, New York, N.Y., a corporation of New York Original application Mar. 16, 1965, Ser. No. 440,163. Divided and this application Mar. 31, 1967, Ser. No. 646,778
Int. Cl. B23k *1/00, 31/02, 5/22*
U.S. Cl. 228—4 6 Claims

ABSTRACT OF THE DISCLOSURE

An integrated circuit encapsulation comprises two substantially identical ceramic body portions having corresponding peripheral troughs for containing a glass sealant which hermetically seals the body portions to leads extending into the enclosure. When sealed, side walls of the troughs clamp on opposite sides of the leads to provide reinforcement. During fabrication, a flat cover is soldered on a cover seat of one of the ceramic body portions by the following steps: placing a solder sealing element along the cover seat; displacing the cover a short distance above the cover seat by means of a magnet mounted in an upper mounting member; bracing the upper mounting member in position by a plurality of solder support members; and heating the assembly to melt the solder.

This application is a division of patent application Ser. No. 440,163, filed Mar. 16, 1965, now Patent No. 3,340,-348.

This invention relates to methods and apparatus for making encapsulations, and more particularly, to methods and apparatus for making hermetically sealed semiconductor encapsulations.

A major recent advance in the electronics field has been the development of the monolithic integrated circuit. This device is made from a single semiconductor slab, various portions of which have been treated such that the slab functions as an essentially complete electronic circuit. These semiconductors must normally be hermetically sealed within an encapsulation to stabilize their characteristics. The encapsulation may comprise a ceramic body portion to which a pair of metal covers are welded. Unfortunately, when low melting temperature metal alloys such as solder are heated to form the weld, they tend to release gases which are trapped within the encapsulation. These gases may, over a period of time, chemically combine with the semiconductor and cause it to deteriorate. Other methods of welding, such as brazing, cannot be used for sealing on the cover plates because they require unduly high temperatures which may damage the semiconductor.

It is an object of this invention to provide a dependable encapsulation for a semiconductor device.

It is another object of this invention to weld metal cover plates to a semiconductor encapsulation by means of a low melting temperature metal alloy such as solder without trapping metal gases within the encapsulation.

These and other objects of the invention are attained in an illustrative embodiment thereof comprising a semiconductor integrated circuit mounted on a ceramic platform which is brazed to a first cover plate. Leads to the integrated circuit are glass sealed between two ceramic body portions which define a trough for containing the glass sealant. Side walls of the ceramic body portions clamp firmly about the leads to reinforce them at their junctures with the glass seal. This reinforcement also greatly reduces the strain on the glass seal imposed by the leads and makes the seals much more dependable than the usual glass-to-metal seal. A second cover plate opposite the semiconductor completes the enclosure within which the semiconductor is hermetically sealed. In this illustrative embodiment the cover plates are solder welded to ceramic body portions.

The entrapment of solder gases within the encapsulation is obviated by an illustrative embodiment of our construction process wherein the first metal cover plate is soldered to the ceramic body portion with the second metal cover plate removed so that solder gases can be driven from the encapsulation. The encapsulation is then placed on a lower mounting member of an assemblage which includes a magnet mounted in an upper mounting member above the encapsulation. The magnet holds the second cover plate directly above the encapsulation. The upper mounting member is free to move vertically on a pair of vertical guide posts, but is displaced from the lower mounting member by four relatively massive solder support members which may be spherical in shape.

In accordance with our process, a solid solder sealing element is included along the cover seat of the encapsulation to which the second cover is to be sealed. The sealing element is made of a solder having a lower melting point than that of the solder support members. With the magnet holding the second cover slightly above the encapsulation, the entire assemblage is heated in a furnace to a temperature above the melting point of the solder support members. The solder sealing element melts first because it has a lower melting point, and with the cover plate appropriately displaced by the magnet, the solder gases are freely vented from the encapsulation. Thereafter, the relatively massive solder support members melt, causing the upper mounting member to descend slowly so that the cover settles into the cover seat of the encapsulation. The vertical guide posts insure that the upper mounting member moves vertically to seat the cover properly while exerting sufficient downward force on the cover so that it seals firmly into the cover seat. In this manner, both covers are firmly sealed to the encapsulation without any trapping of solder gases. Of course, our encapsulation could be used for enclosing various types of semiconductor devices as well as devices made of other materials.

These and other objects of the invention will be more clearly understood from a consideration of the following detailed description taken in conjunction with the accompanying drawing in which.

Figure 2:
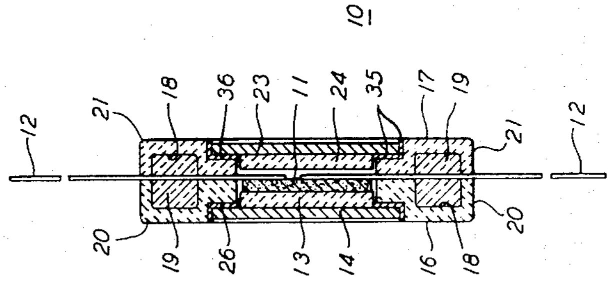
FIG. 2 is a view taken along line 2—2 of FIG. 1.
Figure 1:
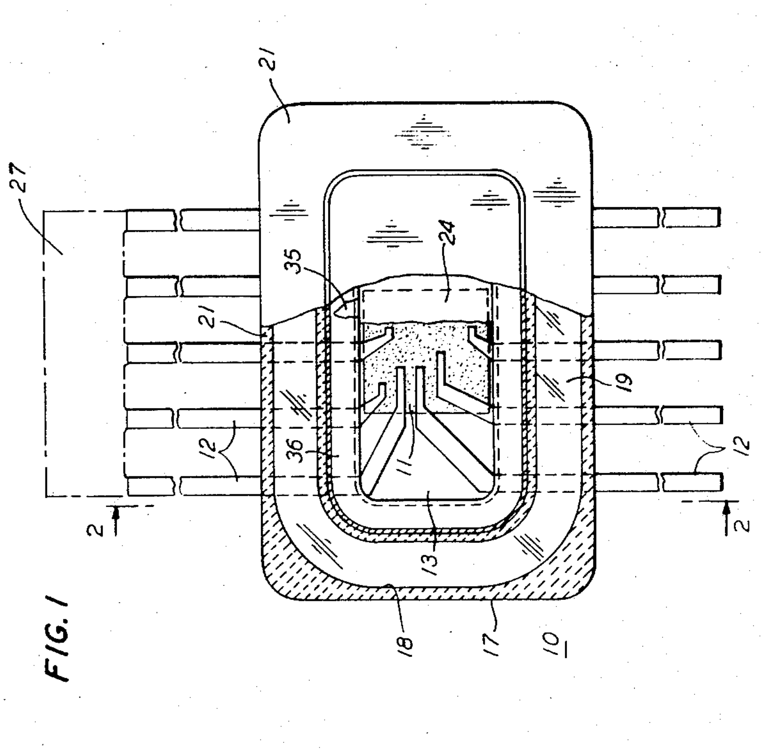
FIG. 1 is a partially cross-sectional view of an encapsulation made in accordance with the principles of the invention.

Referring now to FIGS. 1 and 2, there is shown an integrated circuit package 10 comprising an integrated circuit 11 to which a plurality of leads 12 are connected. Integrated circuit 11 may be formed in a known manner from a single slab of semiconductive material such as silicon, which is appropriately treated to perform all of the functions of a complete electronic circuit. The integrated circuit 11 is bonded to a ceramic platform 13 which in turn is bonded to a first cover plate 14. Located on opposite sides of the leads 12 are a first ceramic body portion 16 and a second ceramic body portion 17. These ceramic body portions each contain peripheral troughs 18 which are in registration with each other when the package is assembled. The troughs 18 are filled with sealing glass 19 which seals the two main body portions 16 and 17 and the leads 12 together as part of a sturdy unitary package. Side walls 20 and 21 of the body portions 16 and 17 are advantageously clamped firmly around the leads 12 to reinforce them at their junctures with the glass seal 19. This reinforces the leads, which is important because they tend to become weakened by the glass seal, and also substantially eliminates the tendency of the leads to chip the glass seal. The reinforcement makes the glass-to-metal seal much more dependable and usually eliminates the necessity of oxidizing the leads to optimize seal strength. The first cover 14 is soldered to body portion 16 while the second cover 23 is soldered to body portion 17. A ceramic spacing element 24 is bonded to the second cover 23.

In accordance with the preferred method of assembly, the leads are glass sealed between portions 16 and 17 by placing a pair of solid glass portions in the troughs 18 on opposite sides of the leads, then heating the subassembly to melt the glass to form the seal 19 which bonds the two ceramic portions together and seals the leads firmly within the subassembly. The mounting platform 13 is separately brazed to cover plate 14 with the integrated circuit 11 thereafter being cemented to the platform. The leads 12 are carefully positioned on the substrate with a solid solder sealing element between the first cover plate 14 and the ceramic body portion 16. The assembly is then heated in a furnace to solder the leads to the semiconductor and to form a solder seal 26 which hermetically welds the cover plate 14 to the ceramic body portion 16. During this operation the second cover 23 is removed from the assembly so that the solder gases are freely vented from the encapsulation. The leads 12 at this stage preferably form part of a single metal sheet 27 shown in FIG. 1. After complete assembly the sheet 27 is cut away to form the distinct leads 12. This technique of using ribbon leads that are initially interconnected aids in aligning the leads when they are connected to the integrated circuit 11.

Figure 3:
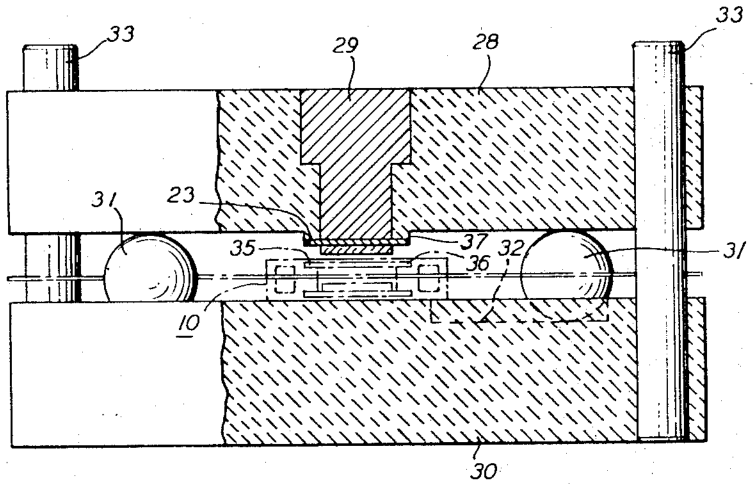
FIG. 3 is an elevational view of apparatus for sealing an encapsulation in accordance with the invention.
Figure 4:
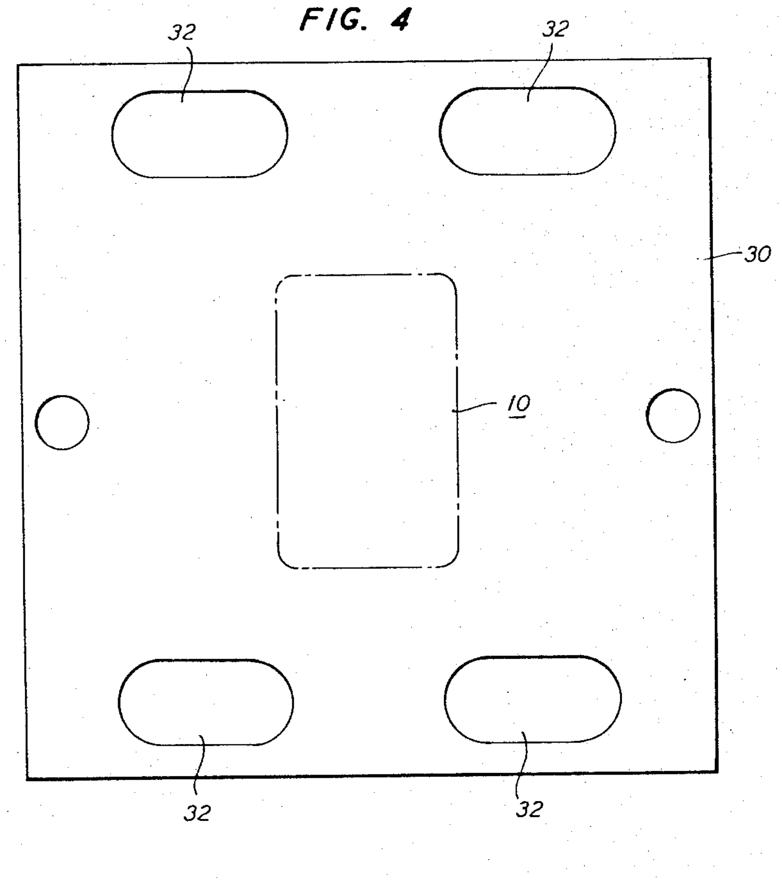
FIG. 4 is a view taken along lines 4—4 of FIG. 3.

The apparatus shown on FIG. 3 is used for soldering the second cover plate 23 onto the ceramic body 17 without trapping solder gases within the final encapsulation. Centrally disposed within an upper mounting member 28 is a permanent magnet 29. The upper mounting member 28 is displaced from a lower mounting member 30 by four relatively massive solder balls 31 which are located in troughs 32 within the lower mounting member 30 as is best shown in FIG. 4. The upper mounting member slides freely in a vertical direction on two vertical guide posts 33.

The integrated circuit package is mounted directly below the magnet 29 on the lower mounting platform 30. The second cover 23 is held by the magnet 29 a small distance above the package 10. An annular solder sealing element is positioned within a cover seat 35 of the ceramic body member 17. The purpose of the solder sealing element, of course, is to form the solder weld 36 of the second cover 23 to the ceramic body portion 17 and for purposes of simplicity will be referred to as sealing element 36. The solder sealing element has a lower melting point than that of the solder support members 31 and is much smaller than the support members. Surrounding the lower end of magnet 29 is a stepped portion 37 of the upper mounting member 28 having a rectangular periphery which matches that of the upper cover plate 23. This aids in precisely positioning the cover plate against the magnet 29.

After these various elements have been precisely positioned as described above, the assemblage of FIG. 3 is placed in a furnace which is heated to a temperature above the melting point of the solder balls 31. Since the solder sealing element 36 has a lower melting point than the support members and is much less massive than the support members, it melts first, and the gases therefrom are free to leave the package 10. Appropriate venting apparatus is used in the furnace in a known manner to drive these solder gases from the integrated circuit package. After the sealing element 35 has been thoroughly melted, the relatively massive solder support members 31 melt, which causes the entire upper mounting member 28 to slowly descend. The vertical guide posts 33 insure that the upper mounting member 28 moves in a vertical direction. This, of course, causes the second cover plate 23 to settle firmly within the cover seat 35, and press firmly against the solder sealing element 36. The cover seat 35 is appropriately metallized so that the solder sealing element 36 welds firmly thereto. The ceramic spacer element 24 of FIG. 2 is included on the interior surface of the second cover plate 23 to keep the solder from "wetting," or adhering to, the entire inner surfare of the cover plate. Since solder does not freely adhere to unmetallized ceramic, the ceramic spacer element 24 restricts the solder sealing element 36 to the cover seat 35. After the solder support members 31 melt, their mass is conveniently collected in troughs 32.

The venting apparatus that is used in the sealing steps preferably maintains the enclosure in an inert or reducing atmosphere that is relatively free of moisture. If the enclosed gas must be oxidizing in nature, it may be necessary to pre-wet the solder on both the cover and cover seat; that is, weld solder to these parts prior to the sealing operation.

The upper and lower mounting members 28 and 30 may be made of ceramic. The permanent magnet 29 may be made of Alnico V, a material which retains its magnetic characteristics at high temperatures. The guide posts 33 and the cover plates 14 and 23 are preferably made of Kovar, which has a low coefficient of expansion. The cover plate 23 of Kovar is also sufficiently ferromagnetic to permit it to be held by the magnet 29. The solder sealing element 36 may be made of 96% lead and 4% tin by weight, which has a melting point of 315 degrees C., while the solder balls 31 may be made of 100% lead, which has a melting point of 327 degrees C. The furnace temperature may then be approximately 350 degrees C. for melting the two solder materials.

It can be appreciated that numerous embodiments other than that shown can employ the principles of our invention. For example, a plurality of integrated circuit packages may be included between upper and lower mounting members 28 and 30 for simultaneously sealing covers on all of them. The support members 31 may assume configurations other than that shown, although the spherical shapes appear to be preferable for easy construction and replacement and for giving a substantially uniform rate of descent of the upper mounting member 28. The sealing elements need not necessarily be made of solder, but they should generally be made of a metal alloy having a sufficiently low melting so that the seals may be made without subjecting the semiconductor to injuriously high temperatures. For silicon devices, the sealing temperatures should be below 370 degrees C. Of course, it should not be implied that our encapsulation and process is limited to integrated circuit semiconductors, or indeed, even necessarily to semiconductors. Numerous other modifications may be made without departing from the spirit and scope of the invention.

What is claimed is:

1. Apparatus for soldering a cover plate on a cover seat of an encapsulation comprising:

- means comprising a lower mounting member for supporting the encapsulation;
- a pair of guide posts extending vertically upwardly from the lower mounting member;
- an upper mounting member movably mounted on the guide posts;
- means comprising a plurality of solder support members mounted on the lower mounting member for supporting the upper mounting member;
- means included in the upper mounting member for holding the cover plate above the encapsulation;
- a solder sealing element located on the cover seat directly below the cover plate;
- means for heating the foregoing assemblage to a temperature above the melting point of the solder support members and the solder sealing element;

and means for venting solder gases from the encapsulation.

2. The apparatus of claim 1 wherein:
the holding means is a permanent magnet.

3. The apparatus of claim 1 wherein:
the solder support members have a higher melting point than the solder sealing element.

4. The apparatus of claim 2 wherein the permanent magnet is made of Alnico V and the cover plate is made of Kovar.

5. Apparatus for welding a flat cover on a cover seat of an encapsulation comprising:
a sealing element located on the cover seat;
means for displacing the flat cover a short distance above the cover seat comprising a plurality of support members;
and means for simultaneously heating the sealing element and the support members to a temperature above their melting points, thereby melting the sealing element and causing the cover plate to settle into the cover seat.

6. The apparatus of claim 5 wherein:
the support members have a higher melting point than the sealing element.

References Cited

UNITED STATES PATENTS

| | | | |
|---|---|---|---|
| 2,451,099 | 10/1948 | La Motte | 29—501 X |
| 2,606,362 | 8/1952 | Martin et al. | 29—501 X |
| 3,208,137 | 9/1965 | Knauf | 29—500 X |
| 3,209,449 | 10/1965 | Valentino et al. | 29—498 X |
| 3,336,664 | 8/1967 | Hawkins | 29—469 X |

JOHN F. CAMPBELL, Primary Examiner

J. L. CLINE, Assistant Examiner

U.S. Cl. X.R.

29—493, 500, 501